(12) United States Patent
Dames et al.

(10) Patent No.: US 12,306,224 B2
(45) Date of Patent: May 20, 2025

(54) ELECTRICITY METER

(71) Applicant: SENTEC LTD, Cambridge (GB)

(72) Inventors: Andrew Dames, Cambridge (GB); Joseph Adam, Cambridge (GB); Jason Morgan, Cambridge (GB)

(73) Assignees: SENSUS SPECTRUM LLC, New Castle, DE (US); SENSUS USA INC., New Castle, DE (US)

( * ) Notice: Subject to any disclaimer, the term of this patent is extended or adjusted under 35 U.S.C. 154(b) by 584 days.

(21) Appl. No.: 17/426,384

(22) PCT Filed: Jan. 28, 2020

(86) PCT No.: PCT/GB2020/050185
§ 371 (c)(1),
(2) Date: Jul. 28, 2021

(87) PCT Pub. No.: WO2020/157477
PCT Pub. Date: Aug. 6, 2020

(65) Prior Publication Data
US 2022/0091167 A1  Mar. 24, 2022

(30) Foreign Application Priority Data
Jan. 29, 2019 (GB) .................................. 1901223

(51) Int. Cl.
*G01R 21/133* (2006.01)
*G01R 21/06* (2006.01)
(52) U.S. Cl.
CPC .......... *G01R 21/133* (2013.01); *G01R 21/06* (2013.01)

(58) Field of Classification Search
CPC ..... H03F 1/02; H03F 1/32; H03F 3/19; H03F 3/24; H04B 1/04
(Continued)

(56) References Cited

U.S. PATENT DOCUMENTS

| 4,920,312 A | 4/1990 | Maruyama |
| 5,736,848 A | 4/1998 | De Vries |

(Continued)

FOREIGN PATENT DOCUMENTS

| CN | 1226968 A | 8/1999 |
| CN | 102934461 A | 2/2013 |

(Continued)

OTHER PUBLICATIONS

International Preliminary Report on Patentability (Chapter 1 of the PCT), PCT/GB2020/050185 filed Jan. 28, 2020, mailed Aug. 12, 2021, 7 pages.

(Continued)

*Primary Examiner* — Raul J Rios Russo
*Assistant Examiner* — Trung Q Nguyen
(74) *Attorney, Agent, or Firm* — Ware, Fressola, Maguire & Barber LLP

(57) ABSTRACT

An electricity meter includes a converter configured to synchronously modulate current and voltage measurement signals and output synchronously-modulated current and voltage measurement signals and also includes a measurement module configured to receive the synchronously-modulated current and voltage measurement signals from the converter and to process the synchronously-modulated current and voltage measurement signals.

20 Claims, 15 Drawing Sheets

(58) Field of Classification Search
USPC ......... 324/763.01, 520, 757.02, 756.07, 537, 324/555, 500
See application file for complete search history.

(56) References Cited

U.S. PATENT DOCUMENTS

| | | | |
|---|---|---|---|
| 5,804,979 A | 9/1998 | Lund | |
| 6,058,354 A * | 5/2000 | Adame | G01R 22/00 324/141 |
| 6,078,870 A | 6/2000 | Windsheimer | |
| 6,275,021 B1 * | 8/2001 | Windsheimer | G01R 22/00 324/120 |
| 9,031,116 B2 | 5/2015 | Young et al. | |
| 9,442,005 B2 * | 9/2016 | Fusco | G01J 1/30 |
| 2003/0227401 A1 * | 12/2003 | Yang | H03M 3/368 341/143 |
| 2014/0253102 A1 * | 9/2014 | Wood | G01R 21/133 324/140 R |
| 2016/0047849 A1 * | 2/2016 | Perndl | G01R 19/10 324/123 R |
| 2016/0282399 A1 | 9/2016 | Veroni | |

FOREIGN PATENT DOCUMENTS

| | | |
|---|---|---|
| EP | 0 840 896 A1 | 2/1997 |
| WO | 97/04321 A1 | 2/1997 |
| WO | 98/04926 A1 | 2/1998 |
| WO | 2015070927 A1 | 5/2015 |

OTHER PUBLICATIONS

International Search Report and Written Opinion, PCT/GB2020/050185, mailed Apr. 17, 2020, 12 pages.
Chinese Search Report, Application No. 2020800116590, dated Feb. 28, 2024, 3 pages.

* cited by examiner

ELECTRICITY METER

FIELD

The present invention relates to an electricity meter, in particular to an electricity meter capable of measuring dc power.

BACKGROUND

The importance of electricity meters which can measure direct current (dc) power and as opposed to alternating current (ac) power is increasing as interest in dc power rises. However, dc electricity meter technology capable of widespread deployment is less developed than for ac electricity meters. Furthermore, existing ac electricity meters tend to perform poorly at dc.

SUMMARY

According to a first aspect of the present invention there is provided an electricity meter comprising a converter configured to synchronously modulate current and voltage measurement signals and to output synchronously-modulated current and voltage measurement signals. The electricity meter also comprises a measurement module configured to receive the synchronously-modulated current and voltage measurement signals from the converter and to process the synchronously-modulated current and voltage measurement signals (for example, to determine power and/or another measurement).

The measurement module may be a single integrated circuit (for example, in the form of a metering chip) or may comprise two or more integrated circuits (for example, an analogue-to-digital converter integrated circuit and a digital processing integrated circuit, such as a microcontroller or other ASIC or FPGA).

The electricity meter preferably has zero offset (for example, <0.1 µV). The electricity meter preferably has a large dynamic range (for example, >1000:1).

The synchronously-modulated current and voltage measurement signals may be sampled with a known, constant timing offset.

The current and voltage measurement signals may be dc current and voltage measurement signals, ac current and voltage measurement signals, or ac current, voltage measurement signals having a fixed or varying dc offset, and/or dc current and voltage measurement signals with an ac ripple. The meter may be capable of generating a total power including any non-dc elements.

The converter may comprise a source of a time-varying signal used for synchronously modulating the current and dc voltage measurement signals. The time-varying signal may have at least one component which is fixed in frequency. The time-varying signal may have at least one component which varies in frequency. The time-varying signal may be a spread spectrum signal. The source may be configured to output a pulse width modulated signal or a mixing signal. The time-varying signal may have only one component. The time-varying signal may comprise a square wave and/or a sinusoidal wave. The converter may be configured not to modulate at (or "avoid") a fundamental frequency or a harmonic frequency of 16.7, 50, 60 or, or at 400 Hz. The time-varying signal may scan through a range of frequencies, for example, for 40 to 80 Hz. In that case, the converter may be configured to avoid modulating at (or "skip) a fundamental frequency (or a harmonic frequency) of 16.7, 50, 60 or, or at 400 Hz or, if it does pass through such a frequency to spend a very small proportion of time, on average, at that frequency (e.g., less than 1% or less than 0.1%). The converter may be configured to modulate at a frequency or frequencies between 1 Hz and 1 MHz. The converter may be configured to modulate at frequency or frequencies between 51 and 59 Hz, between 61 and 65 Hz and/or between 67 and 390 Hz.

The source of a time-varying signal may take the form of a crystal oscillator, a hardware timer, or a waveform generator or be a port for receiving the time-varying signal from an external source.

The electricity meter, optionally the converter, may comprise first and second modulators configured to synchronously modulate the current and voltage measurement signals, respectively, and to output the synchronously-modulated current and voltage measurement signals, respectively. The first and second modulators may comprise first and second bus exchange switches, respectively. The first and second modulators may comprise first and second sets of switching devices, respectively. The first and second modulators may comprise first and second sets of field effect transistors, respectively. The first and second modulators may comprise first and second sets of analogue switches, respectively. The first and second modulators may comprise first and second sets of 4-quadrant analogue multipliers, respectively.

The electricity meter, optionally the measurement module, may comprise first and second analogue-to-digital converters for digitising the synchronously-modulated current and voltage measurement signals, respectively and outputting digitised, synchronously-modulated current and voltage measurement signals. The first and second analogue-to-digital converters may be contained in a single integrated circuit.

The electricity meter, optionally the measurement module, may comprise a digital calculating unit to calculate a current value, a voltage value, a power value and/or an energy value. The digital calculating unit may be configured to calculate the power value by multiplying the digitised, synchronously-modulated current and voltage measurement signals. The digital calculating unit may comprise a microprocessor running a computer program to calculate the current value, the voltage value, the power value and/or the energy value. The digital calculating unit may comprise hardware logic to calculate the current value, the voltage value, the power value and/or the energy value.

The electricity meter, optionally the measurement module, may comprise at least one output device to providing a current value, a voltage value, a power value and/or an energy value. The at least one output device may comprise a display for displaying the current value, the voltage value, the power value and/or the energy value. The at least one output device may comprise a network interface for transmitting the current value, the voltage value, the power value and/or the energy value.

The electricity meter preferably comprises a meter housing containing the converter and the measurement module. The converter and measurement module may be supported on the same PCB or one respective PCBs which may be contained in a meter housing.

The electricity meter may further comprise an input for receiving the current measurement signal from a remote current sensor. The remote current sensor may be inside or outside a meter housing.

The electricity meter may further comprise a current sensor arranged to provide the current measurement signal.

The current sensor may be dc coupled to a modulator (e.g., the first modulator) for modulating the current measurement signal. The remote current sensor or current sensor may be a shunt. The electricity meter may further comprise first and second conductors for transferring power from a source to a load;

wherein the remote current or current source is configured to measure current flowing through the first conductor. The shunt may be disposed before or after the load. The second conductor may be a neutral conductor. The electricity meter may further comprise first and second connections to the shunt for providing the current measurement signal and a modulator (e.g., the first modulator) directly connected to the shunt via the first and second connections. At least one of the first and second connections between the shunt and the modulator comprise the same material as the shunt. The shunt may comprise a metal alloy including copper, nickel and manganese, optionally Manganin (®) or an alloy comprising 84% copper, 12% manganese, and 4% nickel. The shunt may comprise a material having a temperature coefficient of electrical resistance of between 0 and $10 \times 10^{-6}$/K or 0 and $10 \times 10^{-6}$/K or between 0 and $20 \times 10^{-6}$/K or 0 and $-20 \times 10^{-6}$/K, for a temperature in a range between 20° C. and 50° C. The remote current sensor or current sensor may be a Hall effect current sensor, a flux gate current sensor, an anisotropic magnetoresistance current sensor, a giant magnetoresistance current sensor or a tunnelling magnetoresistance current sensor.

The electricity meter may be a dc electricity meter and/or measurement module. The electricity meter may comply with an ANSI standard and/or an IEC standard for electricity meters.

According to a second aspect of the present invention there is provided a system comprising an electric power source, an output to a power sink, optionally, the power sink; and the electricity meter of the first aspect of the invention interposed in an electrical path between the electric power source and the output to a power sink.

The system may be a photovoltaic system, and the electric power source may comprise a photovoltaic panel and the power sink may comprise a distribution network, energy storage or a load.

The system may be an electric vehicle charging system, and the electric power source may be a distribution system and the energy storage may be an electric vehicle energy storage device (e.g., battery or battery pack).

The system may be a dc grid system, and the electric power source may comprise an electricity power source or storage system and the power sink is a load.

The system may further comprise a dc-dc converter interposed in the electrical path between the electric power source and the electricity meter or between the electricity meter and the output to the power sink.

According to a third aspect of the present invention there is provided a method comprising performing current and voltage measurements to produce current and voltage measurement signals, respectively and, in an electricity meter, synchronously modulating the current and voltage measurement signals and output synchronously-modulated current and voltage measurement signals and measuring the synchronously-modulated current and voltage measurement signals

BRIEF DESCRIPTION OF THE DRAWINGS

Certain embodiments of the present invention will now be described, by way of example, with reference to the accompanying drawings, in which:

FIG. 11b shows plots of a first set of modulated current and voltage signals obtained from the first set of input current and voltage signals shown in FIG. 11a;

FIG. 11d is a plot of a calculated power obtained by multiplying the first set of current and voltage signals shown in FIG. 11a;

FIG. 12b shows plots of a second set of modulated current and voltage signals obtained from the second set of input current and voltage signals shown in FIG. 12a;

FIG. 12d is a plot of a calculated power obtained by multiplying the second set of current and voltage signals shown in FIG. 12a;

FIG. 13b shows plots of a third set of modulated current and voltage signals obtained from the third set of input current and voltage signals shown in FIG. 13a;

FIG. 13d is a plot of a calculated power obtained by multiplying the third set of current and voltage signals shown in FIG. 12a;

DETAILED DESCRIPTION OF CERTAIN EMBODIMENTS

Figure 1:
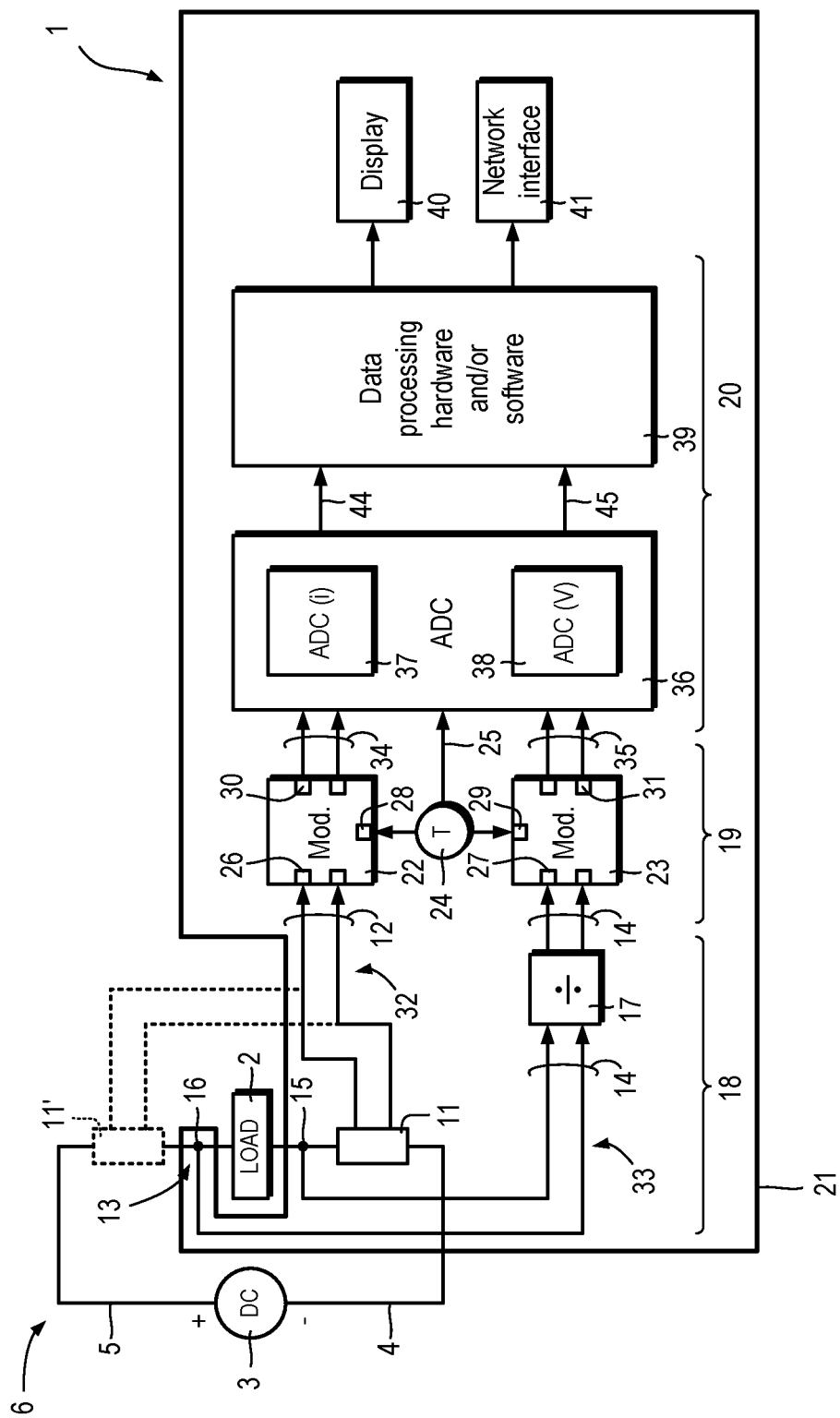
FIG. 1 is a schematic block diagram of an electricity meter.

The present invention is based on the insight that an measurement module of an ac electricity meter can be used to measure dc electricity with low error (as well as still being able to measure ac electricity) by synchronously modulating current and voltage signals and then demodulating the modulated current and voltage signals in the ac electricity meter.

In the following, like parts are denoted with like reference numerals.

Referring to FIG. 1, an electricity meter 1, together with a load 2, a power supply 3 and conductive paths 4, 5 connecting the load 2 and supply 3 to form a circuit 6, is shown. The power supply 3 takes the form of a dc supply. The load 2 may vary over time thereby resulting in an ac component to the current, i. Moreover, the supply 3, may vary over time thereby also resulting in an ac component to the current, i.

The electricity meter 1 includes a current sensor ii which produces a signal 12 (herein referred to as the "current measurement signal" or simply "current signal") proportional to the current, i, in the circuit 6.

The current sensor 11 is disposed on the low side (i.e., relative to the load 2). Alternatively, a high-side current sensor 11' can be sued. The current sensor ii takes the form of a resistive shunt. The current sensor 11, however, may take the form of another sensor capable sensing a dc current such as, for example, a flux gate sensor, a Hall-effect sensor, a giant magnetoresistance (GMR) sensor or an anisotropic magnetoresistance (AMR) sensor. Preferably, the current sensor 11 is able to produce a differential signal 12 which can help to reduce electrical and magnetic interference. The current sensor ii that produces a single-ended signal can be used.

The electricity meter 1 also includes a voltage sensor 13 which produces a signal 14 (herein referred to as the "voltage measurement signal" or simply "voltage signal"). The voltage sensor 13 preferably comprises a pair of taps 15, 16 either side of the load 2. Preferably the taps 15, 16 are connected as close as possible to the load, preferably using a four-point ("Kelvin") arrangement to help reduce possible losses in current being measured as power in the load 3. Preferably, the voltage sensor 13 is able to produce a differential signal 14 which can help to reduce electrical and magnetic interference.

The electricity meter 12 may include an attenuation circuit 17 for passively attenuating the voltage signal 14. The attenuation circuit 17 may take the form of a voltage divider.

The electricity meter 1 includes a sensor section 18 which includes the current and voltage sensors 11, 13, a converter section 19 (herein referred to simply as the "converter") for synchronously modulating the current and voltage signals 12, 14, and an measurement section 20. The sections 18, 19, 20 are generally contained within a meter housing 21.

The converter 18 comprises first and second modulators 22, 23 and a timing reference source 24 (herein also referred to as a "time-varying signal source") providing a timing reference 25 (herein referred to as a "time-varying signal").

The modulators 22, 24 have respective signal input(s) 26, 27, timing reference inputs 28, 29 and modulated signal output(s) 30, 31.

The first modulator 22 receives the current signal 12 via signal path(s) 32 at its input(s) 26 and the second modulator 23 receives the voltage signal 14 (which may be attenuated by the attenuation circuit 17) via signal path(s) 34 at its inputs 27. Any phase shift introduced by additional components (not shown) between sensors 11, 13 and their respective modulators 22, 23 is matched between the inputs 26, 27. The signal paths 32, 33 may incorporate EMC protection, biasing and filtering passive components.

The timing reference source 24 may take the form of a crystal oscillator, a hardware timer, or a waveform generator or be a port for receiving the signal from an external source. The timing reference 25 is provided to the modulators 22, 23 via inputs 28, 29. Additionally or alternatively, the timing reference 25 may be provided to a sampling system 31.

The modulators 22, 23 synchronously modulate the current and voltage signals 12, 14 using the timing reference 25 and output synchronously-modulated current and voltage signals 34, 35, respectively.

The measurement section 20 includes an analogue-to-digital conversion unit 36 (herein also referred to as a "sampling system") comprising first and second analogue-to-digital converters 37, 38 and a data processing unit 39. The measurement section 20 may take the form an integrated circuit, such as a metering chip. The measurement section 20, however, may comprise two or more integrated circuits. For example, the analogue-to-digital conversion unit 36 may take the form of an integrated circuit and the data processing unit 39 may take the form of another integrated circuit, such as microcontroller, ASIC, DSP, FPGA or other suitable form of processing device.

The electricity meter 1 further comprises a display 40 and, optionally, a network interface 41 such as wireless network interface.

The analogue-to-digital conversion unit 36 receives the modulated current signal 34 via signal path(s) 42 and the modulated voltage signal 35 via signal path(s) 43. Any phase shift introduced by additional components (not shown) between sensors modulators 22, 23 and the analogue-to-digital conversion unit is matched. The signal paths 42, 43 may incorporate biasing, coupling and filtering passive components. Preferably, the modulators 22, 23 produce respective differential signals 34, 35 to minimise electrical and magnetic interference.

The modulated signals 34, 35 are preferably simultaneously sampled by the analogue-to-digital converter unit 36 running at a rate significantly higher than the timing reference 25 and converted into a steam 44, 45 of digital data representing the modulated signals. The modulated signals 34, 35 may, in some cases, be sampled with a known, constant timing offset. The stream of digital data representing the modulated signals 34, 36 preferably takes the form of paired voltage and current samples 44, 45.

The stream of digital data 44, 45 is presented to a digital processing unit 36 that dc-modulates the digital representation 44, 45 of the modulated signals by multiplying the current and voltage values in a pair and performing filtering.

The digital processing unit 36 may comprise a microprocessor (not shown) which runs software (not shown) and memory (not shown) and/or hardware logic configured to demodulate the data in software and/or hardware.

Figure 2:
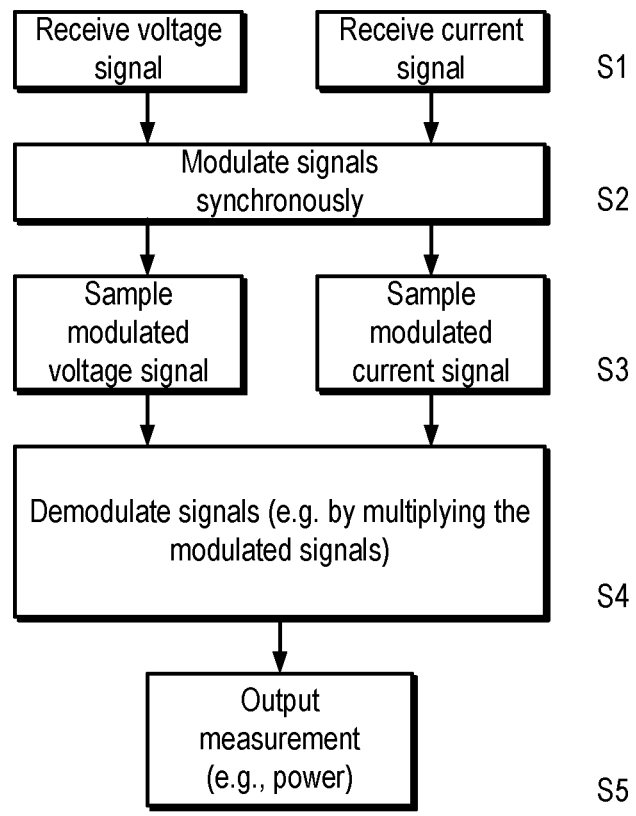
FIG. 2 is a process flow of a method of capturing and processing signals in an electricity meter.

Referring also to FIG. 2, signal capture and processing is shown.

The voltage and current signals are continuously measured (step Si) and modulated synchronously (step S2). The modulated signals are sampled (step S3) and then demodulated, e.g., by multiplication or by using the timing reference (step S4). The resulting measurement, e.g., power and/or current, is output (step S5).

Figure 3:
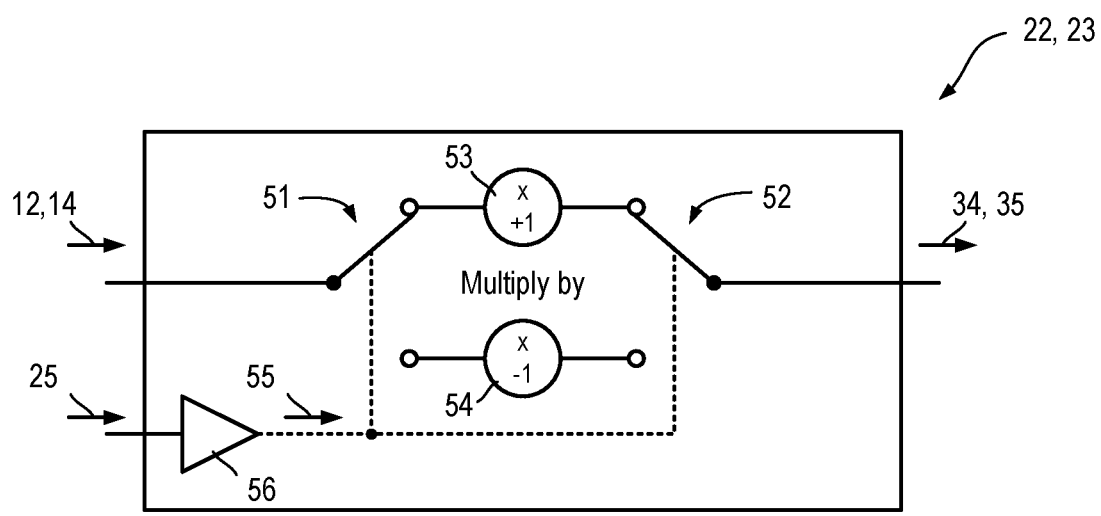
FIG. 3 is a schematic block diagram of a first modulator.

Referring to FIG. 3, a modulator 22, 23 can be viewed as a pair of switches 51, 52 that route an input signal 12, 14 alternatively through a pair of multipliers 53, 54, one having a multiplication factor of +1 and the other having a multiplication factors of 1, to produce a modulated output 34, 35.

The switches 51, 52 are synchronised with a common timing signal 55 created from a control circuit 56 derived from the timing reference 25.

The modulators 22, 23 can be implemented in several difference ways. Generally, however, analogue multipliers tend to be costly and unstable and so an implementation employing switches, such as MOSFETS and other forms of transistors, can be used.

Figure 4:
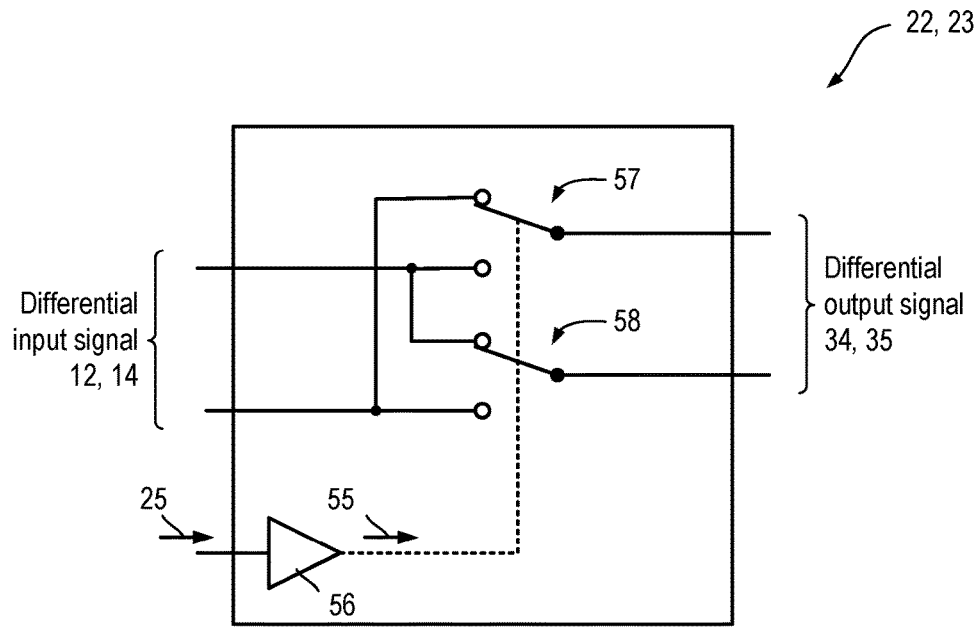
FIG. 4 is a schematic block diagram of a second modulator.

Referring to FIG. 4, a first example of a modulator 22, 23 which can handle a differential input signal 12, 14 and output a differential output signal 34, 35 is shown.

The modulator 22, 23 can be implemented a pair of synchronised, double-pole, double throw (DPDT) switches 57, 58. These may be implemented as discrete components or by a set of MOSFETs.

Figure 5:
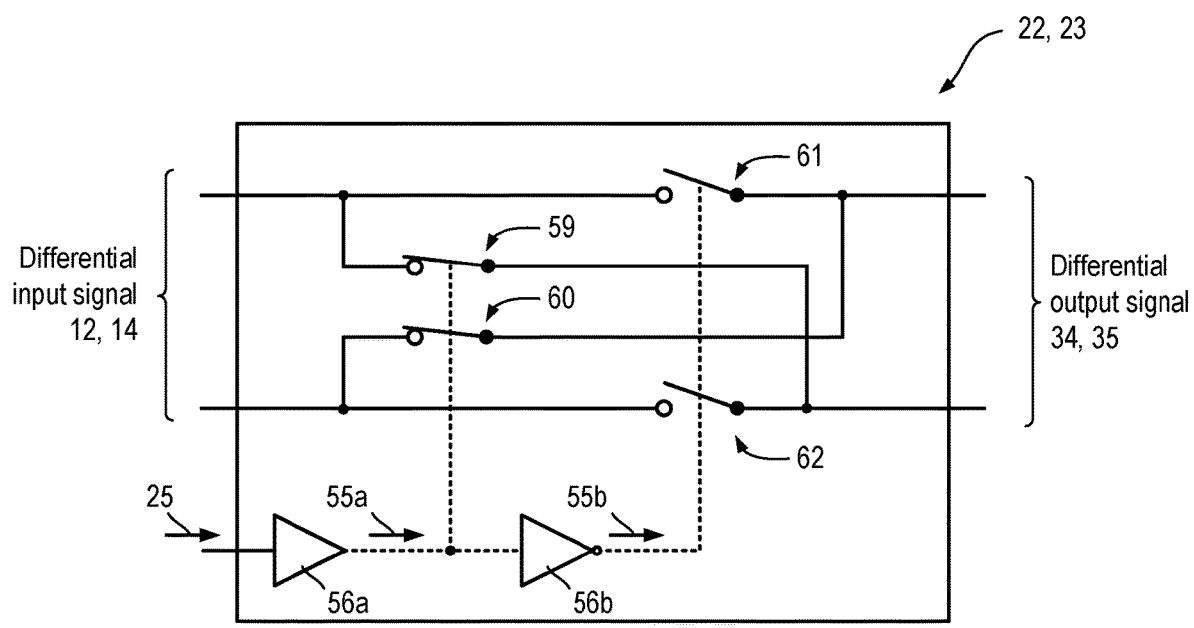
FIG. 5 is a schematic block diagram of a third modulator.

Referring to FIG. 5, a second, preferred example of a modulator 22, 23 which can handle a differential input signal 12, 14 and output a differential output signal 34, 35 is shown.

Instead of using DPDT switches, the modulator 22, 23 can be implemented a synchronised, a crossing pair of single-pole, single throw switches 59, 60 and follow-through pair of single-pole, single throw switches 61, 62. The internal control circuit 56 is split into two parts 56a, 56b providing first and second timing signals 55a, 55b which are in antiphase.

When the first timing signal 55a is enabled, then first and second switches 59, 60 are closed thereby connecting the first input and the second output and the second input and the first output, respectively. The second timing signal 55b is disabled and so third and fourth switches 61, 61 are open.

When the second timing signal 55a is disabled, then first and second switches 59, 60 are open. The second timing signal 55b is enabled and so third and fourth switches 61, 61 are closed thereby connecting the first input and the first output and the second input and the second output, respectively.

Figure 6:
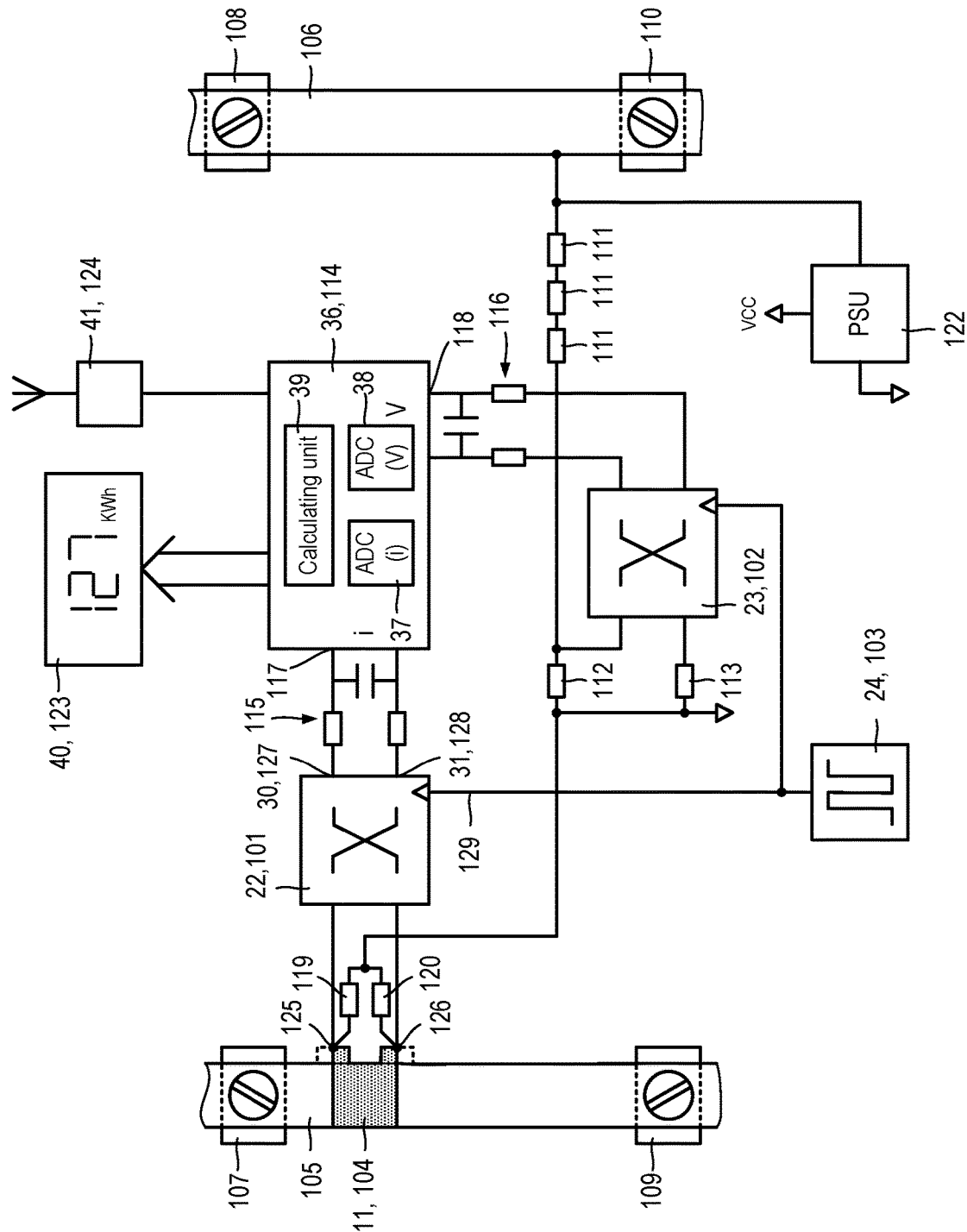
FIG. 6 is a schematic block diagram of an electricity meter which includes a current sensor in the form of a current shunt.

Referring to FIG. 6, a further example of an electricity meter 1' is shown.

In this example, the modulators 22, 23 take the form of bus exchange switches which generates a suitable level signal for direct connection to metering chip 20 (such as a Cirrus CS5484)

Preferably, there is a low dc offset in high current applications since a low emf drop at maximum current can help to minimise thermal dissipation, e.g., 150 µΩ for 100 A-rated meters is typical and 75 µΩ for 200 A-rated meters.

The meter 1' can achieve good gain stability since the shunt impedance is very low and the switch impedance is a few ohms. The modulation frequency may be between 1 Hz and 60 Hz and so the phase shift into a 1 nF capacitance needed for direct connection to some differential ADC inputs is small.

The meter 1' comprises two bus bars 105, 106, the live (or "hot") wire 105 and the neutral bar 106. Clamps or blade connectors are provided to the supply 107, 108 and the load 109, 110. A resistive element 104 is provided in the live bar, for example in the form of Manganin (RTM) welded to copper on either side. First and second connectors 125, 126 to the switch element 22 are provided. This is, for example, a bus exchange switch, e.g., one of five switches in an IDT QS3383 bus exchange chip. This is switched between two states by the control line 129.

In a first state, the first connector 125 is connected to the first bus exchange output 127 and the second connector 126 is connected to the second bus exchange output 128. In a second state, the first connector 125 is connected to the second bus exchange output 128 and the second connector 126 is connected to the first bus exchange output 127.

These signals are then fed into the differential current sensing inputs 117 of a metering chip 114. Control line 129 is provided by a square wave oscillator 103. This is also used by switch 102 to switch the voltage signal, divided by resistor chain 111, 112, with a resistor 113 to balance the impedance into the switch 102. A display 123 of cumulative energy is provided, as well as an optional radio link 124 for reporting consumption data remotely.

Care is taken when connecting the exchange switch inputs to the shunt to avoid thermocouple emfs. These are caused by temperature differences between dissimilar metal junctions, one being the shunt itself, for example, Manganin (®M) connections to copper. This can be as low as 0.2 µV/K. Further reductions can be made by minimising the temperature differences between the ends of the shunt sense resistor. This can be done by making the assembly symmetric.

Figure 7A:
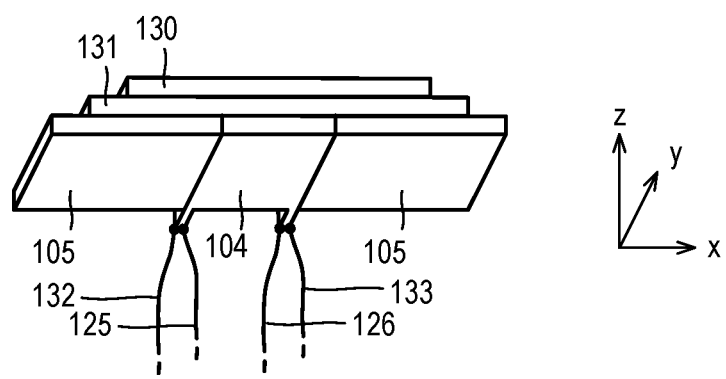
FIG. 7a is perspective view of a conductor and a first current shunt.
Figure 7B:
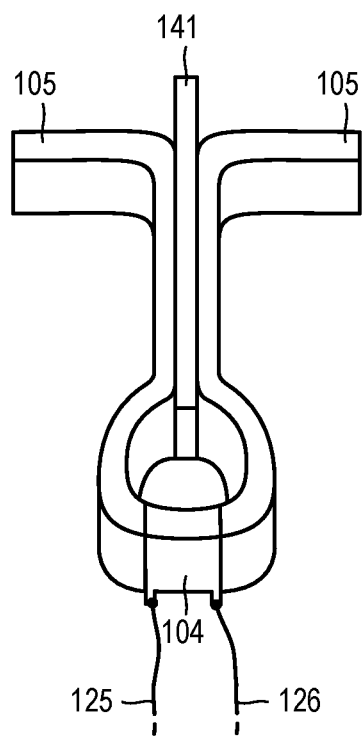
FIG. 7b is perspective view of a conductor and a second current shunt.

Referring to FIGS. 7a and 7b, thermocouple emfs can also be reduced by using an electrically insulating thermal bypass across the shunt 130, 141.

Thermocouple emfs can by be reduced by measuring the temperature difference across the shunt and compensating for it using a design or per unit cal coefficient. The temperature difference can be measured directly using the thermal emf across the shunt from an additional pair of connecting wires 132, 133 made from a different material.

Other points of potential thermal emf before modulation are any connectors between the shunt and the terminals on the switch IC, and temperature gradients across the switch itself. These can be reduced by careful board layout, use of direct soldering of copper wire 125, 126 to the shunt terminals.

For this reason, it may be advantageous to minimise interconnects. The exchange switch can be an IC-type device, such as Texas Instruments CBT3383, ON Semiconductor 7W13383 or made of four discrete FETS or two dual FETs or an FET array with a differential pair of out of phase gate drives.

The ground for the electronics can simply be taken from the bus bar on either side of the shunt, or from a pair of, e.g., 1-ohm, resistors 119, 120 dividing the emf across the shunt to minimise the common mode emf. The resistors 119, 120 divert a small portion of the current from the shunt, but will be accounted for in the normal meter calibration step.

Apart from thermal emfs, sources of input referred dc offset include charge injection from the switch control signal onto the ac output, capacitive coupling of the switch control signal (or external magnetic or electric field at the switching frequency onto the output). Conversion of common mode dc signal to ac output. Coupling of exchange switch Vcc noise at the modulation frequency to the output.

Thus, the electricity meter uses direct modulation of the shunt output voltage up to an ac frequency such that the dc current and/or power can then be measured by an ac system. The voltage signal, which can be attenuated before analogue-to-digital conversion, can also be modulated if desired before sampling or done after sampling. The electricity meter can use robust, low-cost parts such as a bus exchange switch directly connected to the shunt output to reduce the zero offset to an extremely low level (e.g. less than 0.1 µV) permitting a wider dynamic range (e.g., up to 1000 to 1) of current and power measurement to be performed with a given shunt, especially useful in high current (e.g., 200 or 400 A) systems where the maximum emf across the shunt has to be limited to control power dissipation and losses.

Existing ac metrology chips typically have very poor performance at dc. For example, although the Cirrus Logic CS5484 chip does not specify a dc offset in its data sheet, specifies a typical stability of dc offset being 4 µV/K. This should be compared with the electricity meter 1 which can measure at ±0.2 µV over 80 K and so stability is better than 3 nV/K, with initial offset of less than 0.1 µV. In another example, Analog Devices ADE7753 specifies a dc offset of ±13 mV maximum.

A normal (non-chopper stabilized) ADC generally relies on matching between parameters between transistors for its dc stability, which limits the offset (at best) to 10-20 µV, but can be much worse. Even traditional chopper-stabilized amplifiers (or ADCs) typically have worse performance because of the high chopping frequency. For example, an expensive, high-stability amplifier, such as ADA4522, has a typical offset 0.7 µV (5 µV max).

The electricity meters herein described also tend to exhibit low or lower noise at low frequencies. Noise in some components can increase at low frequencies due to 1/f effects. For example, the noise spectral density of ADA 4622-x op-amp exhibits a floor increase below the 1/f corner. The electricity meters herein described allow lower noise measurements to be made at lower frequencies.

Figure 8:
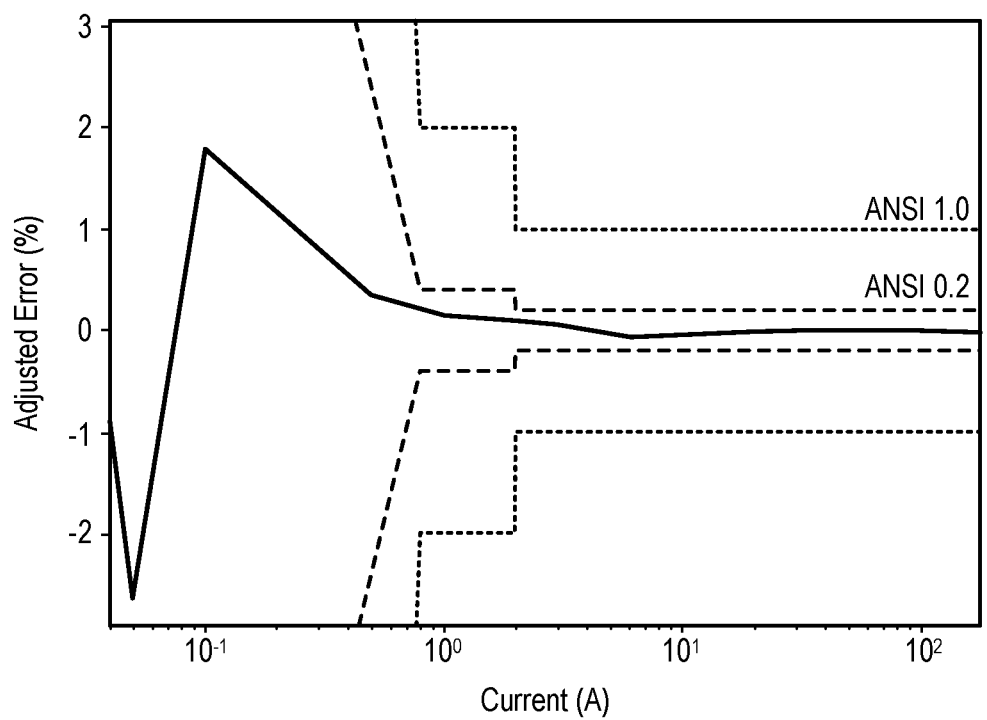
FIG. 8 is a plot of dc meter error against current.

Referring to FIG. 8, this enables dc power meters to have the same or better performance as, for example, a class 0.2 ANSI power meter.

Figure 9:
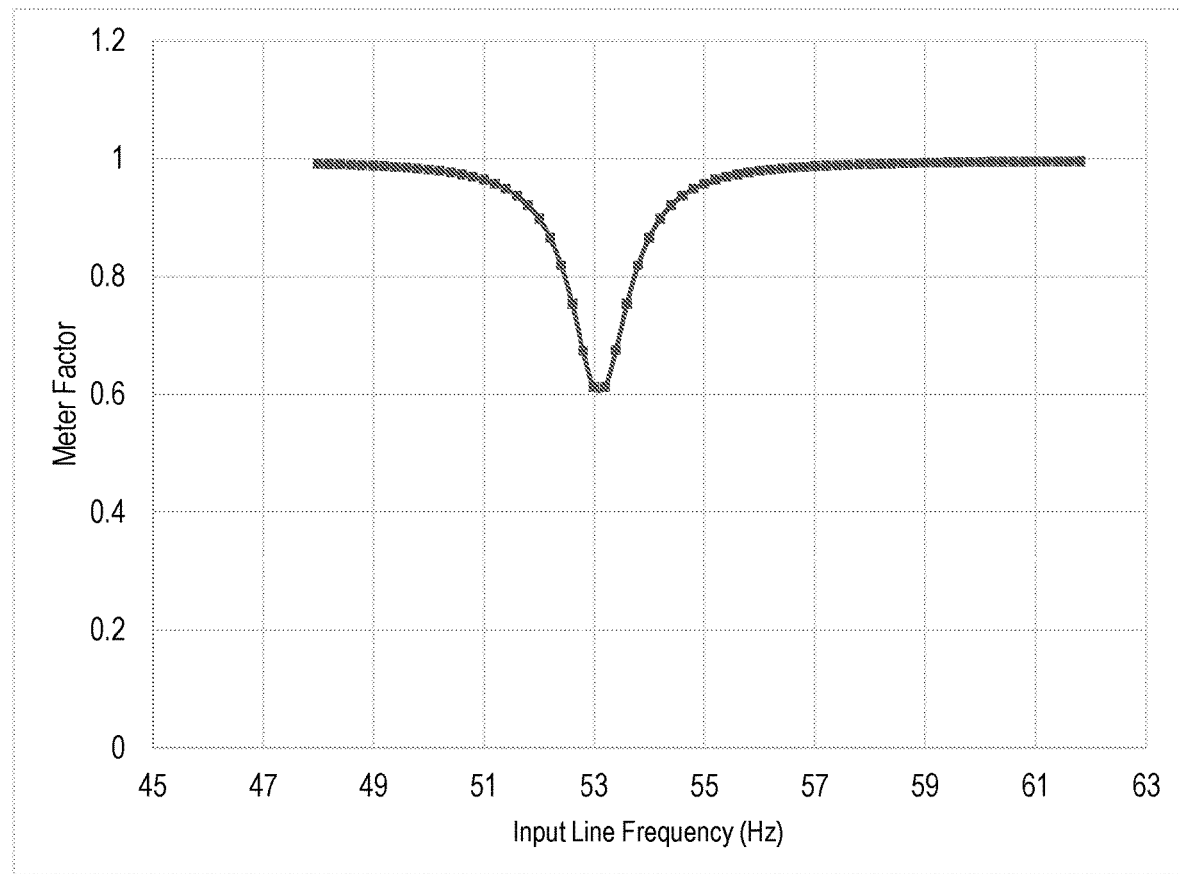
FIG. 9 is a plot of processing loss as a function of cut-off frequency of a single-pole low-pass filter.

Referring to FIG. 9, a simulated frequency response of the electric meter is shown. The response is for a meter using square wave modulation at 53.1 Hz and a high-pass filter having a 0.1 Hz cut off.

There is a hole in response at modulation frequency, which in this case is 53.1 Hz, with a width equal to the bandwidth of the high-pass filter. There is a consistent error at low frequency due to processing loss of square wave modulation with limited bandwidth. Error increases with frequency due to limited high-frequency bandwidth.

Even though 55 Hz sits between frequencies often used in electricity supply (namely 50 and 60 Hz), it is preferred to avoid 55 Hz since its $10^{th}$ harmonic clashes with $11^{th}$ harmonic of a 50 Hz supply, and $12^{th}$ harmonic clashes with 11th harmonic of a 60 Hz supply.

Figure 10:
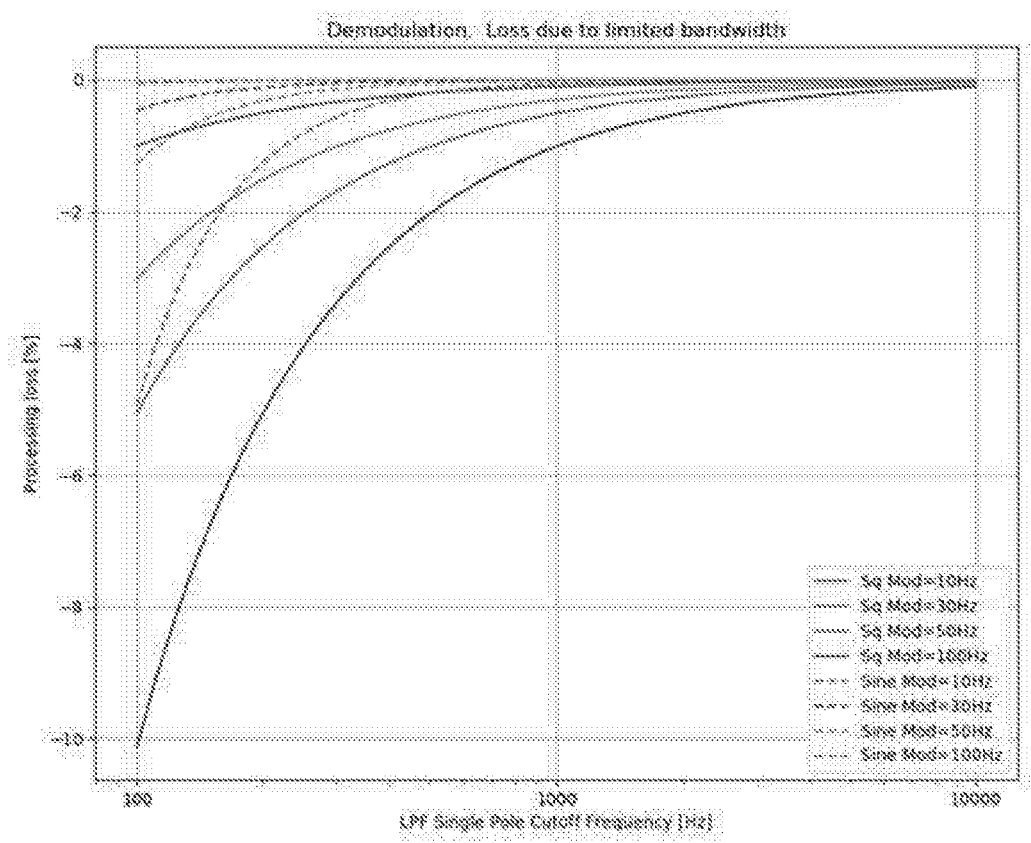
FIG. 10 is a plot of frequency response of an electricity meter.

Referring to FIG. 10, a numerical simulation of loss of output due to limited bandwidth of amplifier/ADC post modulator is shown.

The plot shows that a square wave modulator is much more sensitive to the overall bandwidth than a sine wave modulator. This is because a significant amount of the energy of the square wave modulator ends up in the higher harmonics. This is acceptable as long as the bandwidth is sufficiently stable.

A range of different modulating signals can be used. The modulating signal can be a square wave, a sinusoidal wave or any wave that has a zero mean. The modulating signal can be a frequency-modulated square wave.

The modulator may be a linear-feedback shift register (LFSR) based modulator or a maximum length sequence (MLS) based modulator. These types of modulator can provide a modulation signal with a wider, flatter bandwidth.

Referring to FIGS. 11a to 11d, a first simulation of the effect of modulating input current and voltage signals and obtaining a power by multiplying together the modulated current and voltage signals is shown.

Figure 11A:
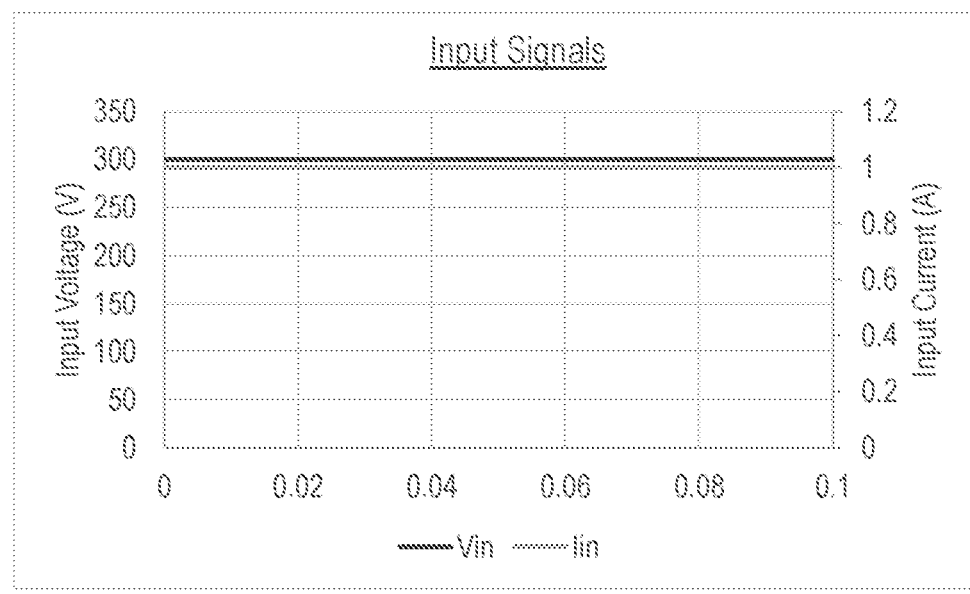
FIG. 11a shows plots of a first set of input current and voltage signals.
Figure 11B:
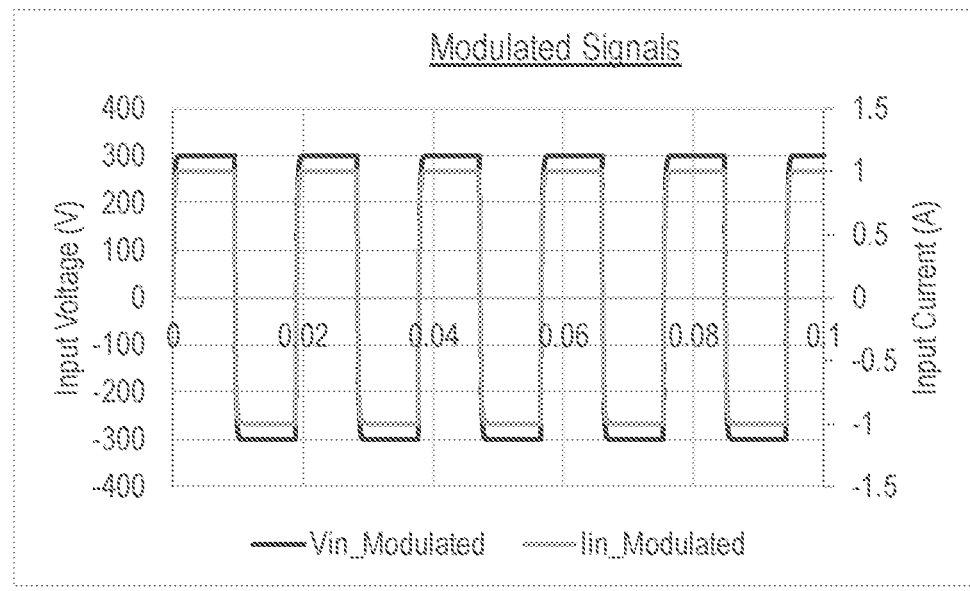
Figure 11C:
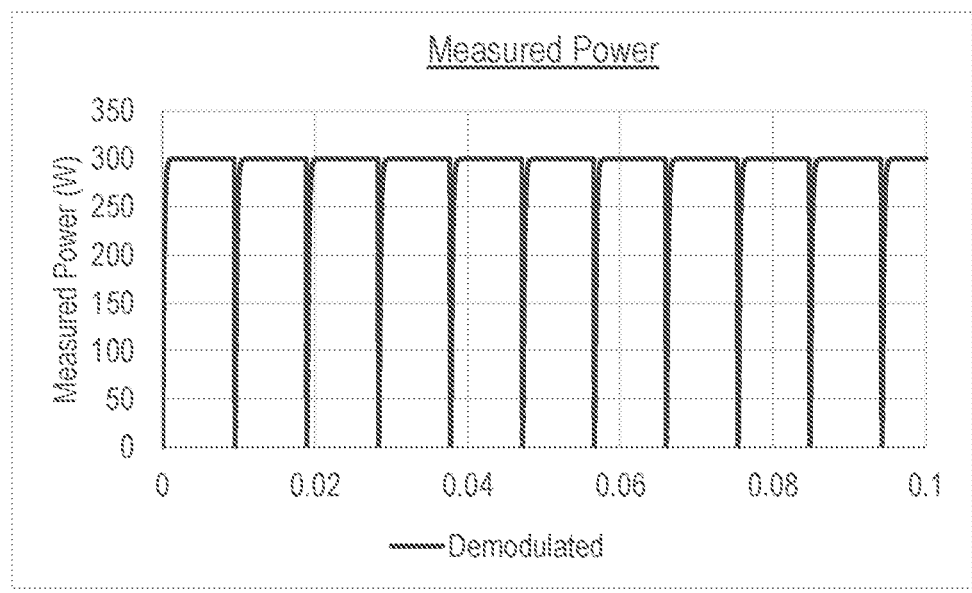
FIG. 11c is a plot of a simulated measured power obtained by multiplying the first set of modulated current and voltage signals shown in FIG. 10b.
Figure 11D:
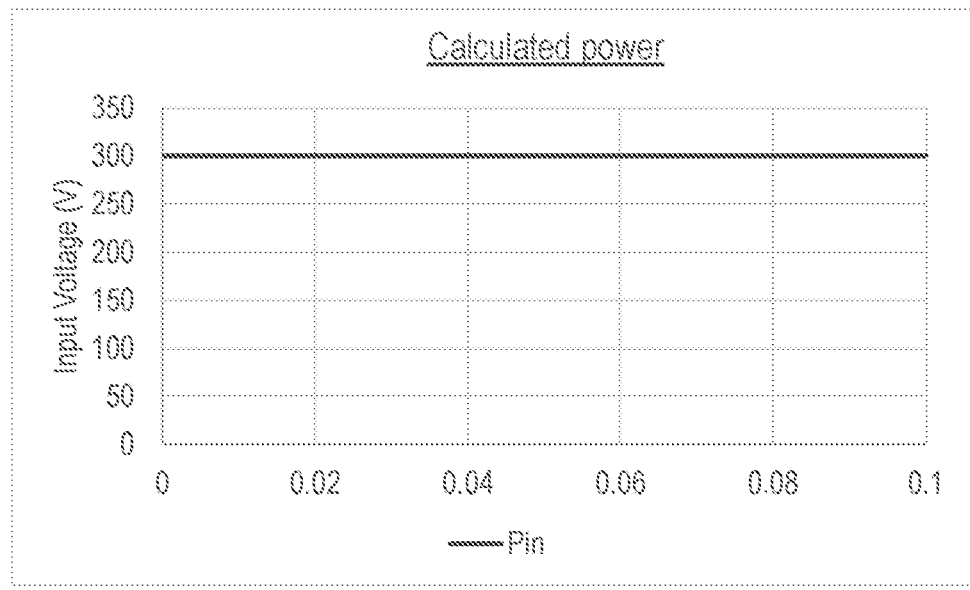

FIG. 11a show the input current and voltage signals which take the form of a dc current set at 1 A and a dc voltage set at 300 V. FIG. 11b show the input current and voltage signals modulated using a 53 Hz square wave. FIG. 11c shows the result of multiplying the together the modulated current and voltage signals which has the effect of demodulating the modulated signals. The resulting power is generally constant at 30o W. Spikes appear in the resulting power, caused by limited bandwidth in the simulation. In a real meter, these spikes, can be easily filtered out with an output filter. Such a filter is generally used to filter out the 2f component of the line power. FIG. 11d shows, for comparison, the result of multiplying the input current and voltage signals directly, i.e., without modulation.

Referring to FIGS. 12a to 12d, a second simulation of the effect of modulating input current and voltage signals and obtaining a power by multiplying together the modulated current and voltage signals is shown.

Figure 12A:
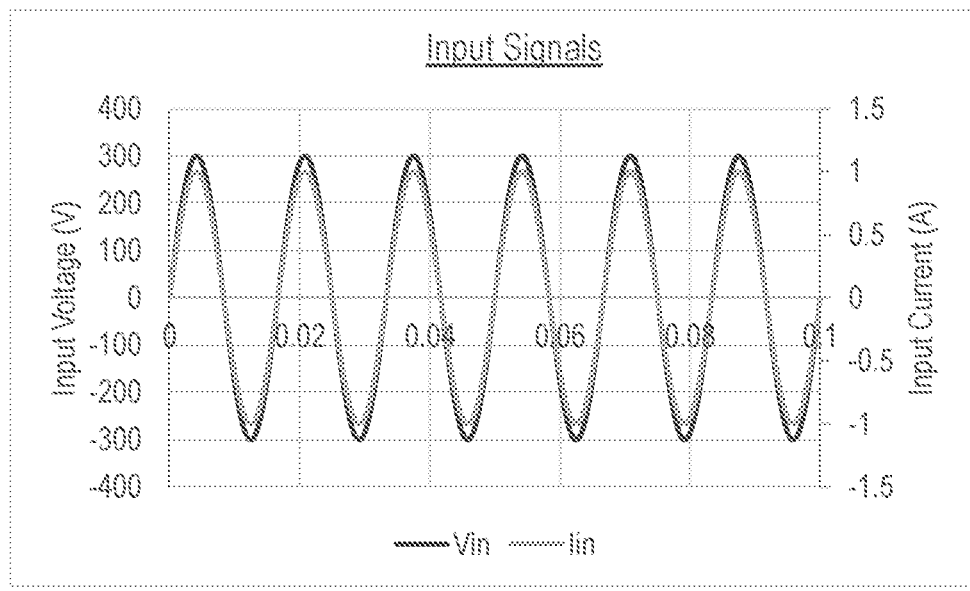
FIG. 12a shows plots of a second set of input current and voltage signals.
Figure 12B:
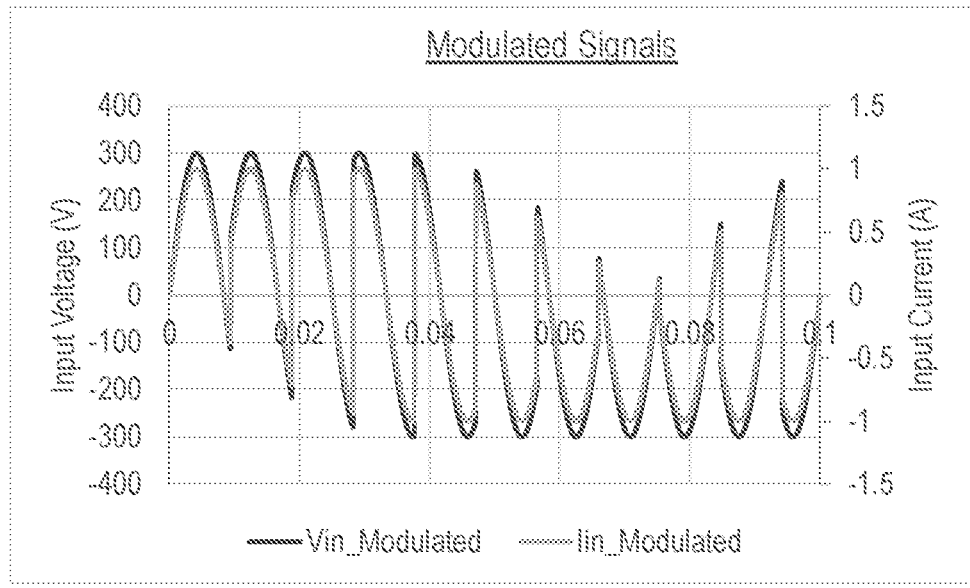
Figure 12C:
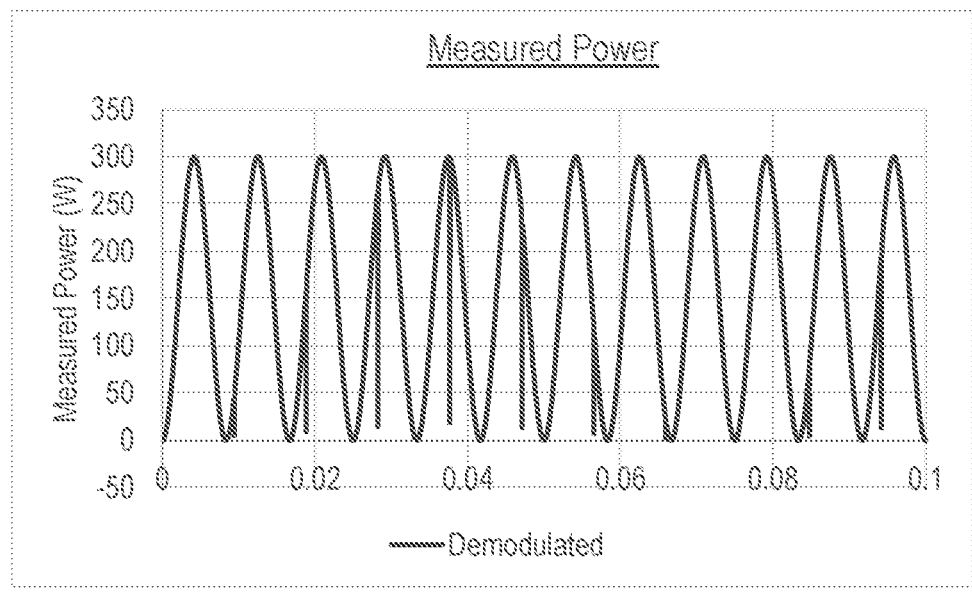
FIG. 12c is a plot of a simulated measured power obtained by multiplying the second set of modulated current and voltage signals shown in FIG. 12b.
Figure 12D:
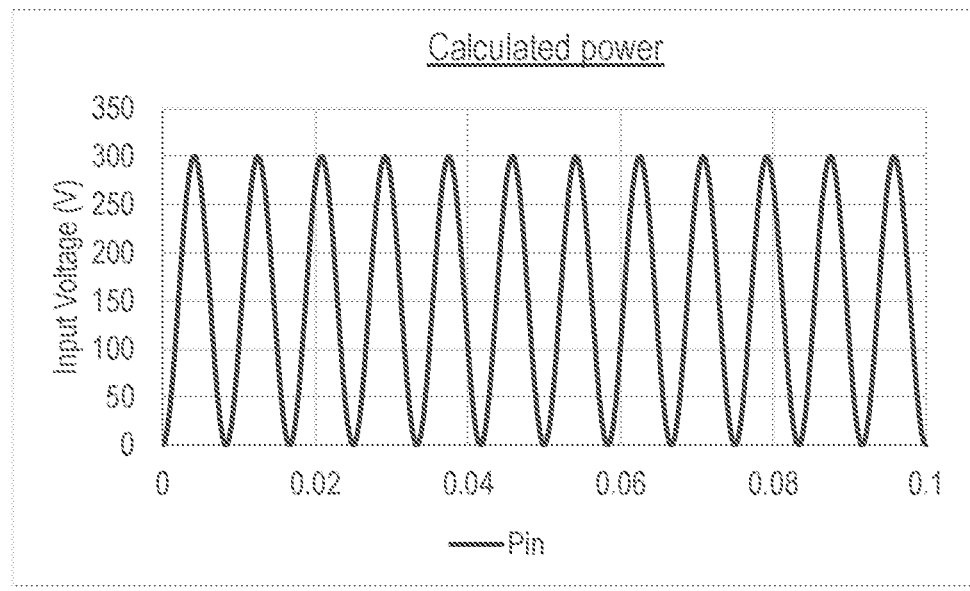

FIG. 12a show the input current and voltage signals which take the form of in-phase, sinusoidal 60 Hz signals having zero dc offset and having a peak current 1 A and a peak voltage of 300 V. FIG. 12b, show the input current and voltage signals modulated using a 53 Hz square wave and FIG. 12c shows the demodulated signal. Although the modulated current and voltage signals appear to meander first above and then below the zero value, once multiplied together the resulting sinusoidal power agrees with the direct result shown in FIG. 12d. Again, spikes appear in the resulting power, caused by limited bandwidth in the simulation.

Figure 13A:
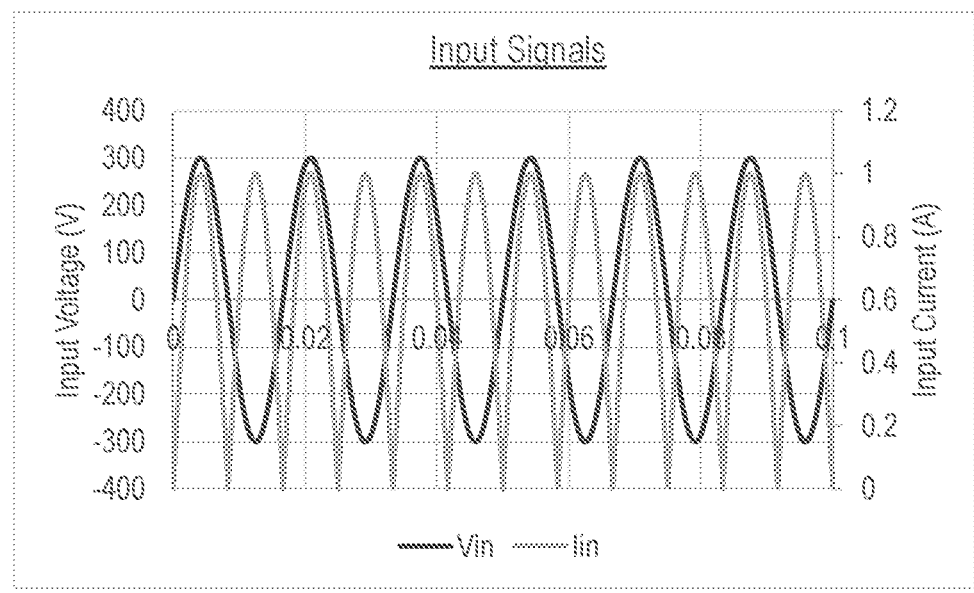
FIG. 13a shows plots of a third set of input current and voltage signals.
Figure 13B:
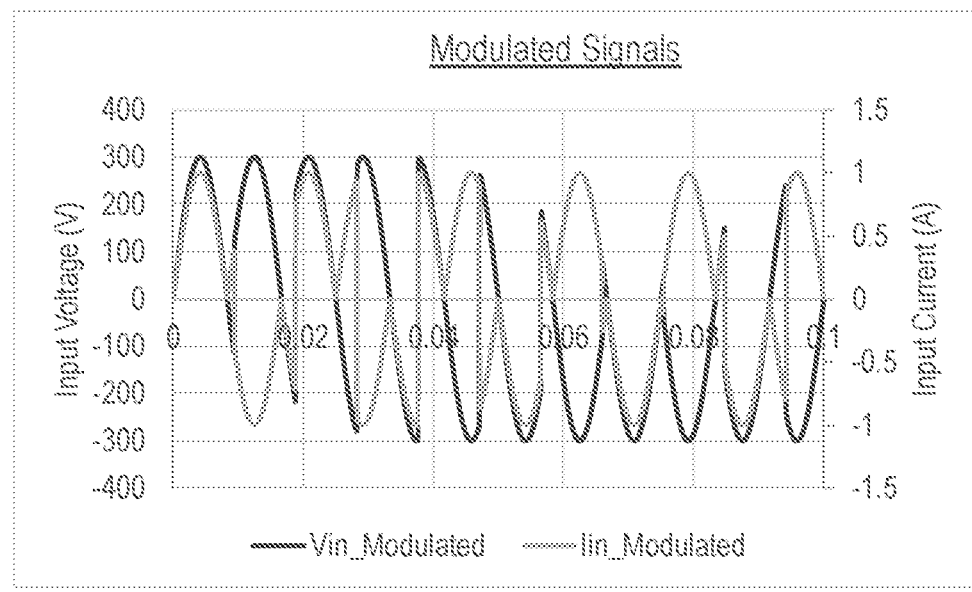

Referring to FIGS. 13a to 13d, a third simulation of the effect of modulating input current and voltage signals and obtaining a power by multiplying together the modulated current and voltage signals is shown FIG. 13a shows a 60 Hz sinusoidal voltage and a full wave rectified 60 Hz current.

Figure 13C:
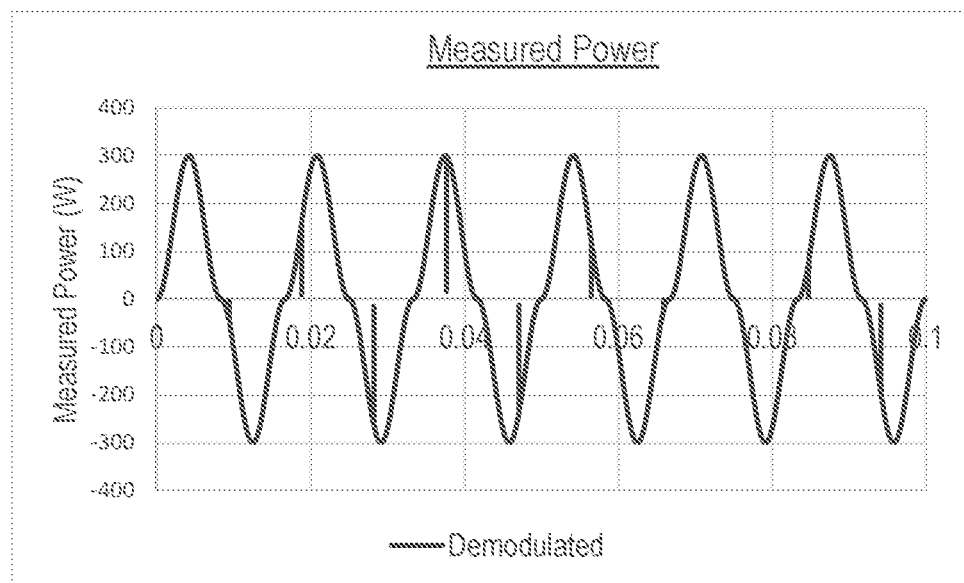
FIG. 13c is a plot of a simulated measured power obtained by multiplying the third set of modulated current and voltage signals shown in FIG. 13b.
Figure 13D:
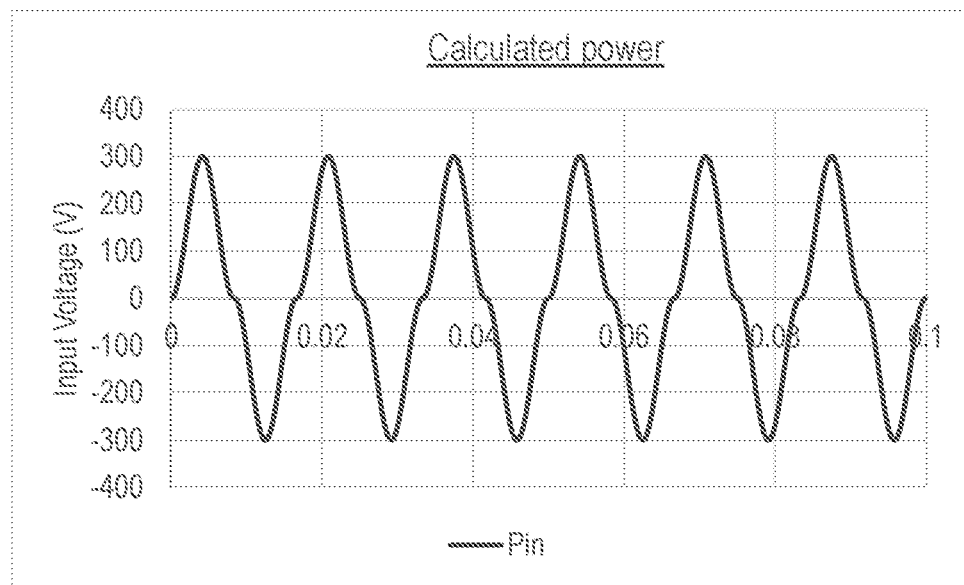

Again, good agreement is shown between the demodulated output shown in FIG. 13c and the directly-computed power shown in FIG. 13d.

The electricity meters herein described can be used in a variety of applications in which is desirable to measure the measure the power generated or consumed.

Figure 14:
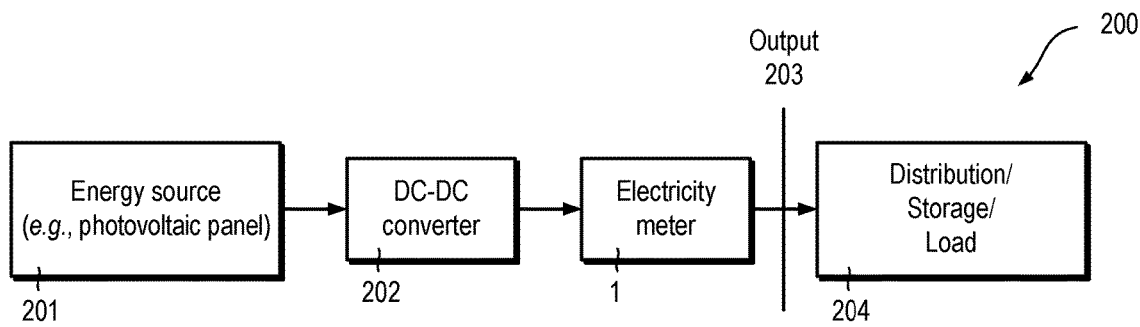
FIG. 14 is a schematic block diagram of a photovoltaic system.

Referring to FIG. 14, a photovoltaic system 200 is shown.

The photovoltaic system 200 includes one or more photovoltaic panel 201 whose dc output is connected to an electricity meter 1. The electricity meter may be connected to a dc-dc converter 202 for changing the output voltage and supplied to an output 203 for feeding to a sink 203 which may take the form of a distribution system, storage (e.g., a battery, or load.

Figure 15:
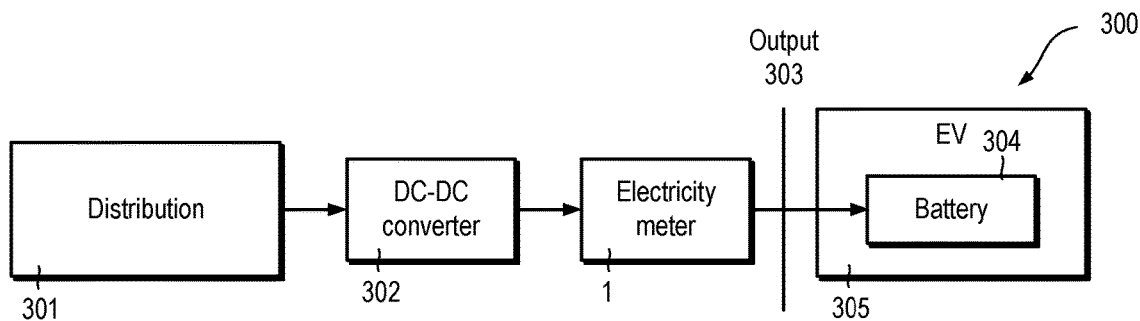
FIG. 15 is a schematic block diagram of an electric vehicle charging system.

Referring to FIG. 15, an electric vehicle charging system 30o is shown.

A dc-dc converter 302 receives power from a distribution system 301 which reduces the voltage level to one suitable for charging. The power is fed through an electricity meter 1 which then provides the power via output 302 to charge a batter 304 in an electric vehicle 305.

Figure 16:
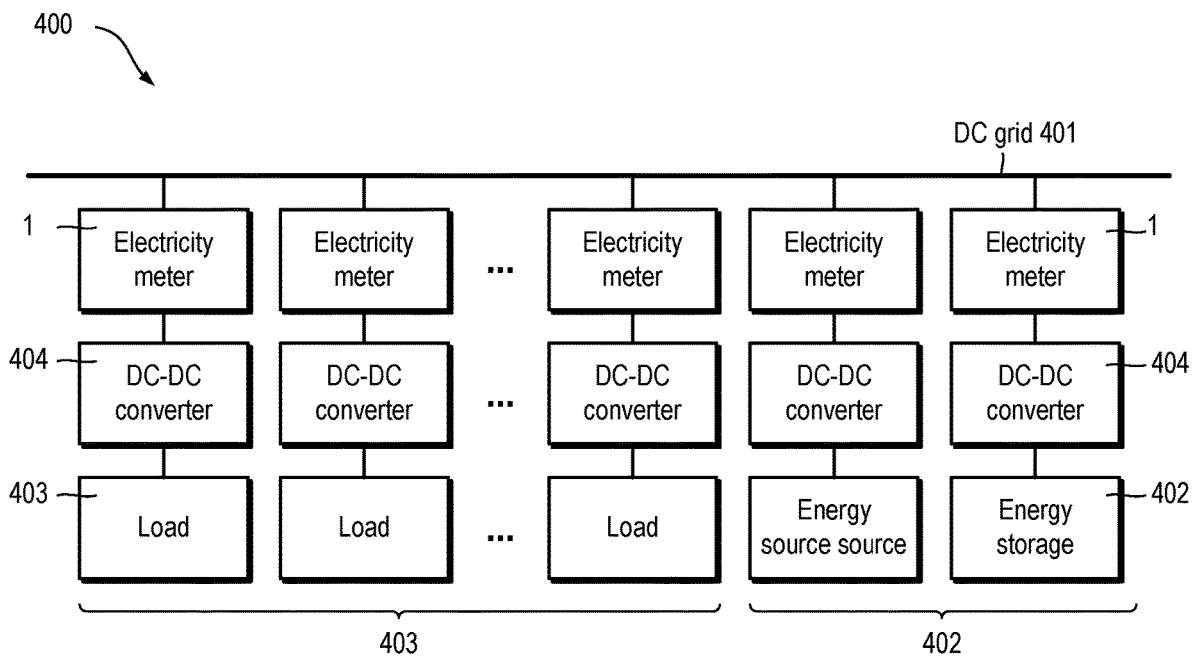
FIG. 16 is a schematic block diagram of a dc grid system.

Referring to FIG. 16, a dc grid system 400 is shown.

The grid system 400 includes a dc grid 401 to which sources 402 and sinks 403. Each source and sink 402, 403 is connected to the dc grid 401 via an electricity meter 1 and a dc-dc converter 404.

Modifications

It will be appreciated that various modifications may be made to the embodiments hereinbefore described. Such modifications may involve equivalent and other features which are already known in the design, manufacture and use of electricity meters and component parts thereof and which may be used instead of or in addition to features already described herein. Features of one embodiment may be replaced or supplemented by features of another embodiment.

The electricity meter may be modified such that it does not measure voltage and so only measures current. One of the modulators may be omitted and one of the analogue-to-digital converters may be omitted. The digital calculating unit may be configured to measure and output current (without measuring and outputting power).

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

The invention claimed is:

1. An electricity meter comprising:
a converter configured to synchronously modulate current and voltage measurement signals and output synchronously-modulated current and voltage measurement signals wherein the converter comprises first and second modulators configured to synchronously modulate the current and voltage measurement signals, respectively, and to output the synchronously-modulated current and voltage measurement signals, respectively; and
a measurement module configured to receive the synchronously-modulated current and voltage measurement signals from the converter and to process the synchronously-modulated current and voltage measurement signals, wherein the measurement module comprises: first and second analog-to-digital converters for digitizing the synchronously-modulated current and voltage measurement signals, respectively and outputting digitized, synchronously-modulated current and voltage measurement signals, wherein the first and second modulators comprise:
respective signal input(s) for the measurement signal(s);
respective timing reference inputs for receiving a timing reference;
respective switches arranged to be synchronously switched using the timing reference for chopping or inverting the measurement signal(s); and
respective modulated signal output(s) for the synchronously-modulated measurement signal(s).

2. The electricity meter of claim 1, wherein the converter comprises:
a source of a time-varying signal used for synchronously modulating the current and voltage measurement signals.

3. The electricity meter of claim 2, wherein the time-varying signal has at least one component that is fixed in frequency, or at least one component that varies in frequency, or at least one component that is fixed in frequency and at least one component that varies in frequency.

4. The electricity meter of claim 1, wherein the converter is configured not to modulate or to modulate on average less than 10% of time at a fundamental frequency or a harmonic frequency of 50, 60 or 16.667, or at 400 Hz.

5. The electricity meter of claim 1, wherein the converter is configured to modulate at frequency or frequencies between 51 and 59 Hz, between 61 and 65 Hz and/or between 67 and 390 Hz.

6. The electricity meter of claim 1, wherein the first and second modulators comprise first and second bus exchange switches, respectively.

7. The electricity meter of claim 1, wherein the first and second modulators comprise first and second sets of switching devices, respectively.

8. The electricity meter of claim 7, wherein the first and second modulators comprise first and second sets of field effect transistors, respectively.

9. The electricity meter of claim 7, wherein the first and second modulators comprise first and second sets of analog switches, respectively.

10. The electricity meter of claim 7, wherein the first and second modulators comprise first and second sets of 4 quadrant analog multipliers, respectively.

11. The electricity meter of claim 1, wherein the measurement module comprises:
a digital calculating unit to calculate a current value, a voltage value, a power value and/or an energy value.

12. The electricity meter of claim 11, wherein the digital calculating unit is configured to calculate the power value by multiplying the digitised, synchronously-modulated current and voltage measurement signals.

13. The electricity meter of claim 1, further comprising:
an input for receiving the current measurement signal from a remote current sensor or a current sensor arranged to provide the current measurement signal, or wherein a current sensor is de coupled to a modulator for modulating the current measurement signal.

14. The electricity meter of claim 13, wherein the remote current sensor or current sensor is a shunt.

15. The electricity meter of claim 14, further comprising:
first and second conductors for transferring power from a source to a load;
wherein the remote current or current sensor is configured to measure current flowing through the first conductor.

16. The electricity meter of claim 14, further comprising:
first and second connections to the shunt for providing the current measurement signal; and
a modulator directly connected to the shunt via the first and second connections.

17. The electricity meter of claim 16, wherein at least one of the first and second connections between the shunt and the modulator comprise the same material as the shunt.

18. The electricity meter of claim 13, wherein the remote current sensor or current sensor is:
a Hall effect current sensor;
a flux gate current sensor;
an anisotropic magnetoresistance current sensor;
a giant magnetoresistance current sensor; or
a tunnelling magnetoresistance current sensor.

19. The electricity meter of claim 1, which is a dc electricity meter.

20. An electricity meter comprising:
a converter configured to synchronously modulate current and voltage measurement signals and output synchronously-modulated current and voltage measurement signals wherein the converter comprises first and second modulators configured to synchronously modulate the current and voltage measurement signals, respectively, and to output the synchronously-modulated current and voltage measurement signals, respectively; and a measurement module configured to receive the synchronously-modulated current and voltage measurement signals from the converter and to process the synchronously-modulated current and voltage measurement signals, wherein the measurement module comprises:

first and second analog-to-digital converters for digitizing the synchronously-modulated current and voltage measurement signals, respectively and outputting digitized, synchronously-modulated current and voltage measurement signals, wherein the electricity meter further comprises:

an input for receiving the current measurement signal from a remote current sensor or a current sensor arranged to provide the current measurement signal, or wherein a current sensor is de coupled to a modulator for modulating the current measurement signal, wherein the remote current sensor or current sensor is a shunt, and wherein at least one of the first and second connections between the shunt and the modulator comprise the same material as the shunt.

* * * * *